United States Patent
Kung et al.

(10) Patent No.: US 12,388,548 B2
(45) Date of Patent: Aug. 12, 2025

(54) HOLDOVER MODE DEVICE, METHOD AND MEASUREMENT AND ADJUSTMENT MODULE

(71) Applicant: FIBER LOGIC COMMUNICATIONS, INC., Hsinchu (TW)

(72) Inventors: Che-Cheng Kung, Hsinchu (TW); Yu-Lun Lo, Hsinchu (TW)

(73) Assignee: FIBER LOGIC COMMUNICATIONS, INC., Hsinchu (TW)

( * ) Notice: Subject to any disclaimer, the term of this patent is extended or adjusted under 35 U.S.C. 154(b) by 219 days.

(21) Appl. No.: 18/314,959

(22) Filed: May 10, 2023

(65) Prior Publication Data

US 2024/0297726 A1 Sep. 5, 2024

(51) Int. Cl.
*H04J 3/06* (2006.01)

(52) U.S. Cl.
CPC .......... *H04J 3/0623* (2013.01); *H04J 3/0617* (2013.01)

(58) Field of Classification Search
CPC ...... H04J 3/0688; H04J 3/0617; H04J 3/0623; H03L 7/08; H03L 7/07; H03L 2207/50; H03L 7/0807; H03L 7/1075; G06F 1/04; G06F 1/12; G06F 1/10; H03K 5/133; H03K 5/082; H03K 2005/00143; H04B 1/16

See application file for complete search history.

(56) References Cited

U.S. PATENT DOCUMENTS

| 11,108,400 B1* | 8/2021 | Armstrong ............ H03L 7/1976 |
| 2002/0008557 A1* | 1/2002 | Abdel-Maguid ..... H03L 7/0994 |
| | | 327/159 |
| 2002/0190764 A1 | 12/2002 | Nichols |

(Continued)

FOREIGN PATENT DOCUMENTS

| CN | 1413384 A | 4/2003 |
| CN | 112272921 A | 1/2021 |

(Continued)

OTHER PUBLICATIONS

Office Action with the first search report for the corresponding TW Appln. 112107908 issued at Jan. 17, 2024.

*Primary Examiner* — Jung Liu
(74) *Attorney, Agent, or Firm* — MUNCY, GEISSLER, OLDS & LOWE, P.C.

(57) ABSTRACT

A holdover mode device is illustrated. When a time synchronization source is not abnormal, a digital PLL uses a time synchronization source as its input clock, and a measurement and adjustment module calculates a variation of a frequency difference between the time synchronization source and a reference clock output by an adjustable oscillator, and builds a frequency difference prediction model according to the variation of the frequency difference. When the time synchronization source is abnormal, the digital PLL uses a buffered time synchronization source as its input clock, and the measurement and adjustment module uses the frequency difference prediction model to calculate a predicted variation of the frequency difference according to buffered frequency difference values, and generates an adjustment signal for adjusting the reference clock according to the predicted variation of the frequency difference.

13 Claims, 8 Drawing Sheets

(56) References Cited

U.S. PATENT DOCUMENTS

| | | | | |
|---|---|---|---|---|
| 2006/0242445 | A1* | 10/2006 | Aweya | H03L 7/08 |
| | | | | 713/400 |
| 2014/0225653 | A1* | 8/2014 | Hara | H03L 7/146 |
| | | | | 327/159 |
| 2015/0222276 | A1* | 8/2015 | Milijevic | H03L 7/087 |
| | | | | 327/147 |
| 2016/0072619 | A1* | 3/2016 | Zhu | H03B 5/32 |
| | | | | 375/376 |
| 2020/0021296 | A1* | 1/2020 | Spijker | H04L 7/0331 |
| 2020/0266823 | A1* | 8/2020 | Chu | H03L 7/143 |
| 2022/0173742 | A1* | 6/2022 | Nelson | H03L 7/1075 |
| 2023/0308104 | A1* | 9/2023 | Nelson | G06F 1/04 |

FOREIGN PATENT DOCUMENTS

| | | | |
|---|---|---|---|
| EP | 0652642 | B1 | 5/2000 |
| EP | 1228567 | B1 | 12/2005 |

* cited by examiner

HOLDOVER MODE DEVICE, METHOD AND MEASUREMENT AND ADJUSTMENT MODULE

TECHNICAL FIELD

The present disclosure relates to a holdover mode device, a holdover mode method and a measurement and adjustment module, and in particularly, to a holdover mode method and a measurement and adjustment module, all of which can enhance a holdover mode when a time synchronization source is abnormal (such as, the time synchronization source disappears or fails, or the software or hardware associated with the time synchronization source fails).

RELATED ART

For a mobile network, the base station can only provide normal and stable transmission quality under the condition of time synchronization. However, when a time synchronization source temporarily fails or disappears, or the synchronization function of the base station itself is abnormal, the base station will enter the holdover mode to maintain the current synchronization accuracy as long as possible until the abnormal situation is eliminated (for example, the time synchronization source has returned to normal, or the abnormal board of the base station has been replaced). Since a frequency of the base station's oscillator (for example, oven-controlled crystal oscillator (OCXO)) drifts slowly over time, in holdover mode, a time difference between the drift of the output clock of a digital phase lock loop (PLL) and the time synchronization source can generally be maintained less than 1500 nanoseconds within 4 hours. The requirement of the time synchronization of the general mobile network is 1500 nanoseconds, but in the most advanced application scenarios (for example, the multiple-input multiple-output (MIMO) function between adjacent base stations of the fifth-generation mobile communication) will require the holdover mode to make the time difference between the drift of the output clock of the digital PLL and the time synchronization source less than 1500 nanoseconds within 8 to 24 hours Therefore, practitioners and researchers in this field are still striving to develop a technical solution capable of enhancing the holdover mode.

SUMMARY

To achieve one objective of the present disclosure, the present disclosure provides a holdover mode device which comprises a digital PLL, a measurement and adjustment module and an adjustable oscillator. The digital PLL is configured to lock an output clock thereof to be an input clock thereof, and to transmit the output clock to at least one hardware module. The measurement and adjustment module is electrically connected to the digital PLL or a time synchronization source. The adjustable oscillator is electrically connected to the measurement and adjustment module, and configured to adjust a reference clock generated by the adjustable oscillator according to an adjustment signal. When the time synchronization source is not abnormal, the digital PLL is configured to use the time synchronization source as the input clock thereof, and the measurement and adjustment module is configured to calculate a variation of a frequency difference between the time synchronization source and the reference clock, and to build a frequency difference prediction model according to the variation of the frequency difference. When the time synchronization source is abnormal, the digital PLL is configured to use a buffered time synchronization source as the input clock thereof, and the measurement and adjustment module is configured to use the frequency difference prediction model to calculate a predicted variation of the frequency difference according to multiple buffered frequency difference values, and to generate the adjustment signal according to the predicted variation of the frequency difference.

To achieve one objective of the present disclosure, the present disclosure provides a holdover mode method which is executed by the above holdover mode device, and further provides a measurement and adjustment module used in the above holdover mode device.

In short, the present disclosure provides a holdover mode method and a measurement and adjustment module, all of which can enhance a holdover mode when the time synchronization source disappears or fails, or the software or hardware associated with the time synchronization source fails.

BRIEF DESCRIPTIONS OF DRAWINGS

DETAILS OF EXEMPLARY EMBODIMENTS

Figure 1:
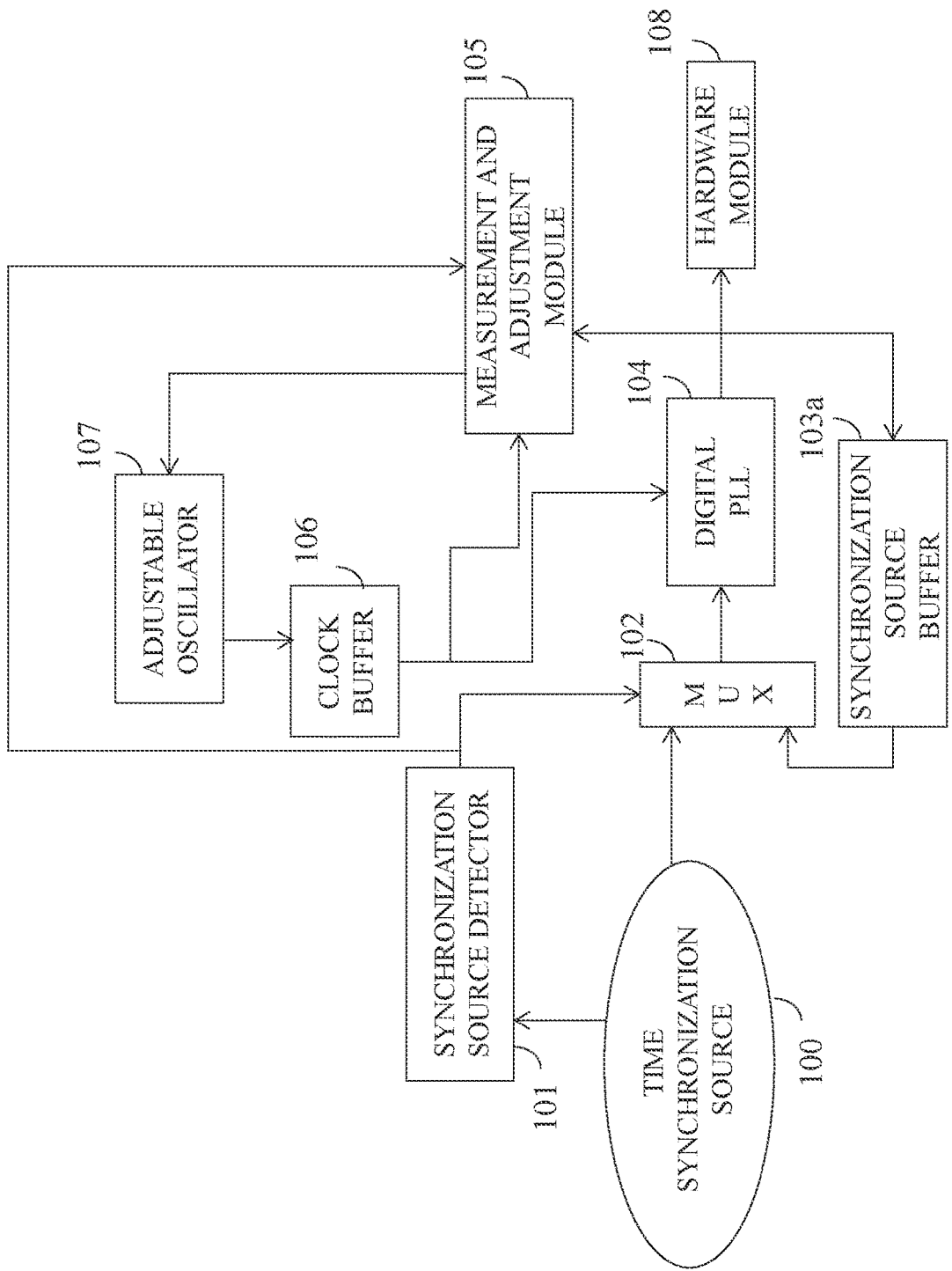
FIG. 1 is a schematic block diagram of a holdover mode device according to an embodiment of the present disclosure.

In order to make the Examiner understand the technical characteristics, content and advantages of the present disclosure and the effects that can be achieved, the present disclosure is hereby combined with the accompanying drawings, and is described in detail as follows in the form of exemplary embodiments, and the drawings used therein is only for illustration, not the true proportion and precise configuration after the implementation of the present disclosure, so it should not be interpreted and limited to the actual implementation of the present disclosure based on the proportion and configuration relationship of the attached drawings.

The present disclosure mainly provides a holdover mode device, a holdover mode method and a measurement and adjustment module used in the holdover mode device. When the time synchronization source is not abnormal, a digital PLL of the holdover mode device locks its output clock to be a time synchronization source, and provides its output clock to at least one hardware module. At the same time, a measurement and adjustment module of the holdover mode device acquires a variation of a frequency difference between the time synchronization source and a reference clock which is generated by the adjustable oscillator and provided to the digital PLL, thus building a frequency difference prediction model accordingly. Next, when the time synchronization source is abnormal, the digital PLL locks its output clock to be the buffered time synchronization source (i.e., the time synchronization source which is buffered before the time synchronization source is abnormal), and provides its output clock to at least one hardware module. Moreover, the measurement and adjustment module uses the frequency difference prediction model to calculate a predicted variation of the frequency difference according to multiple buffered frequency difference values (i.e. the frequency difference values which are buffered before the time synchronization source is abnormal), and generates an adjustment signal for adjusting a reference clock according to the predicted variation of the frequency difference, such that it can prevents the output clock of the digital PLL from deviating too much from time synchronization source in real time (i.e. preventing a time difference between a drift of the output clock of the digital PLL and the time synchronization source from being too large).

Furthermore, by using the holdover mode device of the present disclosure, in the holdover mode, a time difference between drift of the output clock of the digital PLL and the time synchronization source is less than 1500 nanoseconds within the at least next 8 to 24 hours. Usually, the holdover time of the holdover mode is uncertain, and in some case, holdover time of the holdover mode is longer than 24 hours, even longer than 72 hours. Thus, by using the holdover mode device, the holdover mode method and the measurement and adjustment module used in the holdover mode device of the present disclosure, once the number of the samples of the variation of the frequency difference between the time synchronization source and the reference clock which is generated by the adjustable oscillator and provided to the digital PLL is enough, a frequency difference prediction model which can predict the variation of the frequency difference in the next 24 hours (even longer than 72 hours) can be built. Even the holdover time of the holdover mode is longer than 24 hours (even longer than 72 hours), the technical solution of the present disclosure can make the time difference between the drift of the output clock of the digital PLL and the time synchronization source less than 1500 nanoseconds. In short, the technical solution of the present disclosure elongates the holdover time of the holdover mode, even if the frequency difference prediction model is a predication function varying with time, it can predict forever regardless, and no matter how long the holdover time of the holdover mode lasts, the drift of the output clock of the digital PLL and the time synchronization source is still less than 1500 nanoseconds.

On the other hand, the holdover mode device provided by the embodiment of the present disclosure is, for example but not limited to, applied to node devices outside the core network equipment of the mobile communication network (that is, the end node device and the intermediary node devices between the end node devices and the core network), such as base stations, switches, routers or gateways. Furthermore, in the process of the gradual development of the smart factory, not only the mobile communication network needs precise time synchronization, but also the node devices other than the main control device of the smart factory (for example, the end node device and the intermediary node devices between the end node devices and the main control device) also require precise time synchronization. Similarly, the holdover mode device, the holdover mode method and the measurement and adjustment module of the embodiments of the present disclosure are also applicable to various application scenarios that require accurate time synchronization.

Refer to FIG. 1, and the holdover mode device at least comprises a digital PLL 104, a measurement and adjustment module 105 and an adjustable oscillator 107. The digital PLL 104 is configured to lock its output clock to be its input clock, and to transmit the clock signal to at least one hardware module 108. The measurement and adjustment module 105 is electrically connected to the digital PLL 104 (in other embodiments, the measurement and adjustment module 105 can be changed to be electrically connected to the time synchronization source 100). The adjustable oscillator 107 is electrically connected to the measurement and adjustment module 105, and is configured to adjust the reference clock generated by it according to the adjustment signal, wherein the reference clock is provided to the digital PLL 104.

When the time synchronization source 100 is not abnormal (p.s. abnormality of the time synchronization source 100 comprises a failure of the time synchronization source 100, a disappearance of the time synchronization source 100 or abnormality of a board card associated with the time synchronization source 100), the digital PLL 104 is configured to use the time synchronization source 100 as the input clock thereof, thus the output clock of the digital PLL 104 is locked to be the time synchronization source 100, and the time synchronization source 100 is output to at least a hardware module 108 via the digital PLL 104. When the time synchronization source 100 is not abnormal, the measurement and adjustment module 105 is configured to calculate a variation of a frequency difference between the time synchronization source 100 and the reference clock, and to build a frequency difference prediction model according to the variation of the frequency difference, wherein the variation of the frequency difference comprises multiple frequency difference values of multiple time points.

When the time synchronization source 100 is abnormal, the digital PLL 104 is configured to use a buffered time synchronization source (i.e. the time synchronization source 100 which is buffered before the time synchronization source 100 is abnormal) as the input clock thereof, thus the output clock of the digital PLL 104 is locked to be the buffered time synchronization source, and the buffered time synchronization source is output to the at least one hardware module 108 via the digital PLL 104. Since the buffered time synchronization source at the present is untrusted, and various factors may cause the buffered time synchronization source output by digital PLL 104 to drift, the measurement and adjustment module 105 uses the frequency difference prediction model to calculate a predicted variation of the frequency difference according to multiple buffered frequency difference values (i.e. the frequency difference values which are buffered before the time synchronization source is abnormal), and generates the adjustment signal according to the predicted variation of the frequency difference, so that the reference clock of the adjustable oscillator 107 can be adjusted according to the adjustment signal.

Usually, to build the frequency difference prediction model, the number of the samples of the frequency difference values should be enough. Thus, before the frequency difference prediction model is not built, if the time synchronization source 100 abnormal, the relevant personnels should be notified, and at the same time, the measurement and adjustment module 105 does not generate the adjustment signal for adjusting the reference clock of the adjustable oscillator 107. Moreover, the frequency difference prediction model is for example, a linear regression model, a nonlinear regression model, a neural network model or a support vector machine model, and the present disclosure is not limited thereto. The adjustable oscillator 107 is for example, an oven-controlled crystal oscillator or a digital temperature-controlled oscillator, and the present disclosure is not limited thereto.

According to the above holdover mode device, the variation of the frequency difference comprises multiple frequency difference values which are for example, accumulated within at least 48 hours, such that the number of the samples of the frequency difference values is enough to build the frequency difference prediction model. The multiple buffered frequency difference values can be for example, the frequency difference values in the past two hours before the time synchronization source 100 is abnormal. Then, the multiple buffered frequency difference values can be used to find a prediction point of the frequency difference prediction model for calculating the predicted variation of the frequency difference, and the predicted variation of the frequency difference comprises the multiple frequency difference values in the next 8 to 24 hours starting from the prediction point. In this way, in the holdover mode, within the next 8 to 24 hours, the time difference between the drift of the output clock of the digital PLL 104 and the time synchronization source 100 is still within 1500 nanoseconds, that is, to meet the requirements of the $5^{th}$ generation mobile communication with multi-input multi-output operation.

Next, the holdover mode device can further comprise a synchronization source detector 101, a multiplexer 102 and a clock buffer 106. The synchronization source detector 101 is electrically connected to the measurement and adjustment module 105 and the time synchronization source 100, and configured to detect whether the time synchronization source 100 is abnormal or not, so as to generate a detection result signal. The multiplexer 102 is electrically connected to the digital PLL 104, the synchronization source detector 101 and the time synchronization source 100, and configured to provide the time synchronization source 100 or the buffered time synchronization source to be the input clock of the digital PLL 104 according to the detection result signal. The clock buffer 106 is electrically connected to the adjustable oscillator 107, the digital PLL 104 and the measurement and adjustment module 105, and configured to buffer the reference clock to provide the reference clock to the digital PLL 104 and the measurement and adjustment module 105.

In the embodiment of FIG. 1, the measurement and adjustment module 105 is electrically connected to the digital PLL 104, and configured to acquire the time synchronization source 100 by receiving the output clock of the digital PLL 104. When the time synchronization source 100 is not abnormal, the measurement and adjustment module 105 measures the time synchronization source 100 by receiving the output clock of the digital PLL 104, and when the time synchronization source 100 is abnormal, the buffered time synchronization source used by the digital PLL 104 is the buffered signal of the output clock of the digital PLL 104. Thus, the holdover mode device can further comprise a synchronization source buffer 103a, wherein the synchronization source buffer 103a is electrically connected to the digital PLL 104 and the multiplexer 102, and configured to buffer the output clock of the digital PLL 104, and the output clock of the digital PLL 104, which is buffered in the synchronization source buffer 103a, acts as the buffered time synchronization source.

Figure 2:
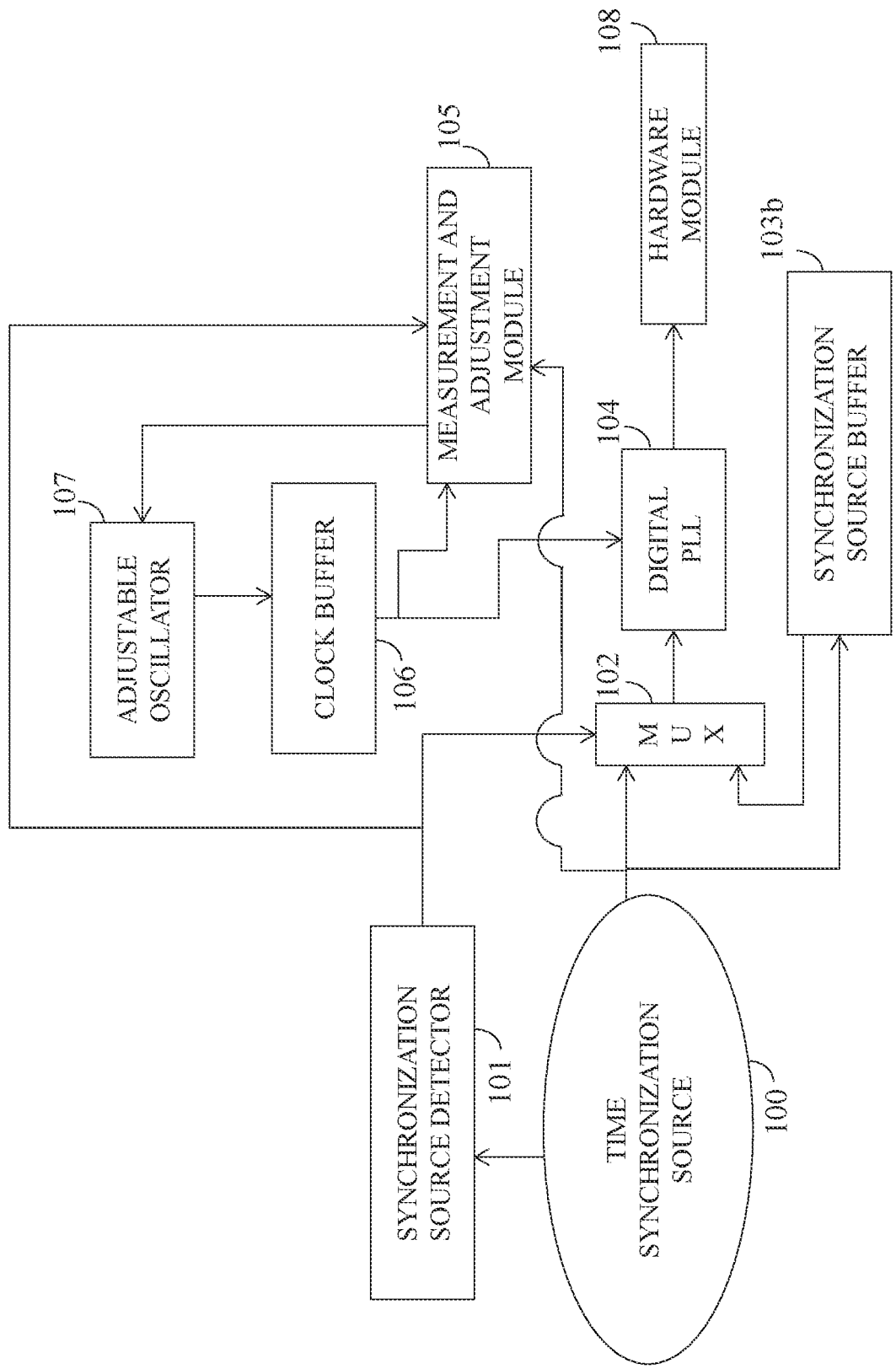
FIG. 2 is a schematic block diagram of a holdover mode device according to another one embodiment of the present disclosure.

Next, refer to FIG. 2, and in the embodiment of FIG. 2, the measurement and adjustment module 105 is electrically connected to the time synchronization source 100, so as to directly acquire the time synchronization source 100. When the time synchronization source 100 is not abnormal, the measurement and adjustment module 105 directly measure the time synchronization source 100, and when the time synchronization source 100 is abnormal, the buffered time synchronization source used by the digital PLL 104 is the buffered signal of the time synchronization source 100. Thus, the holdover mode device further comprises a synchronization source buffer 103b which is electrically connected to the time synchronization source 100 and the multiplexer 102, the synchronization source buffer 103b is configured to buffer the time synchronization source 100, and the time synchronization source 100 buffered in the synchronization source buffer 103b acts as the buffered time synchronization source.

Figure 3:
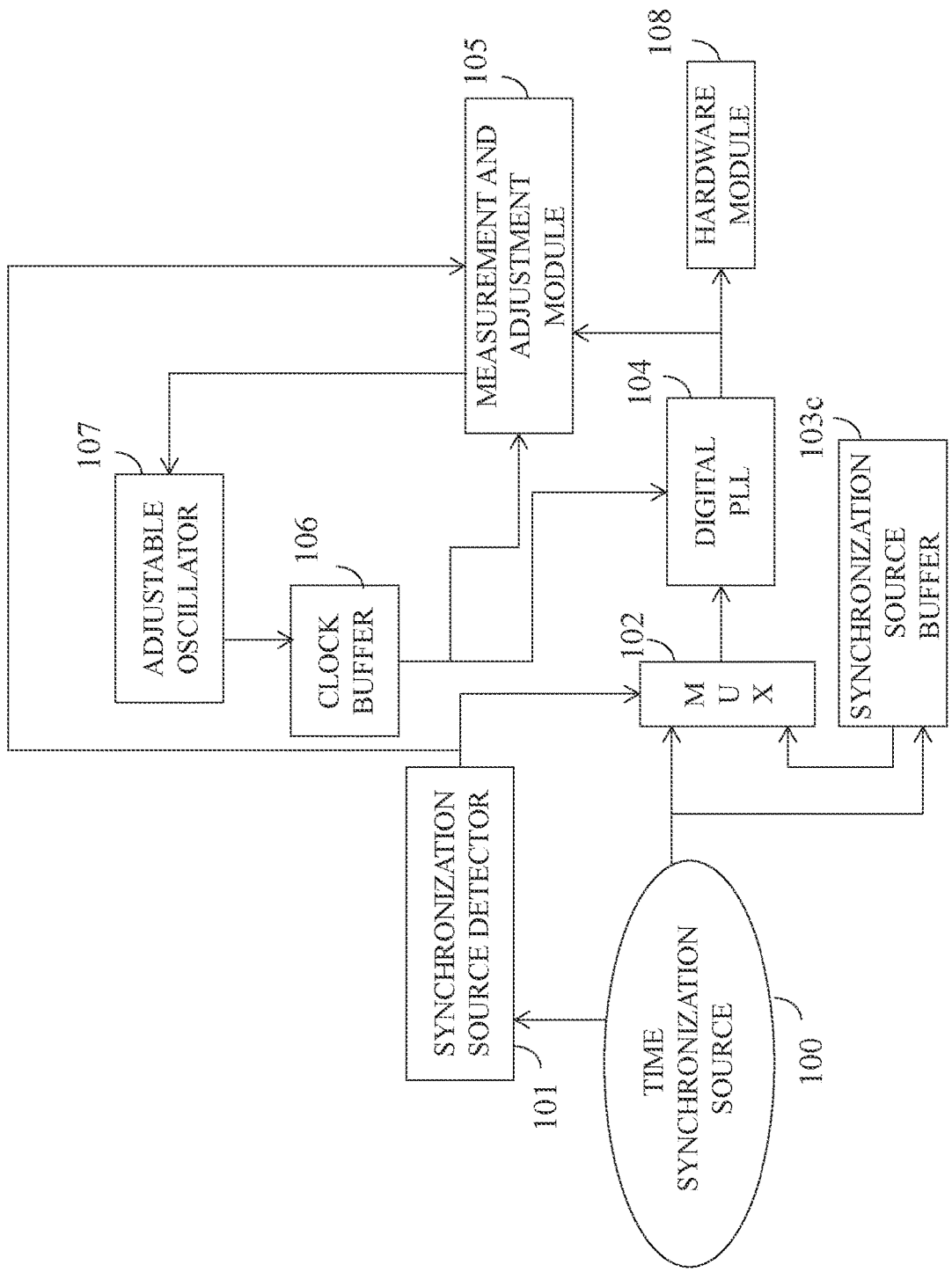
FIG. 3 is a schematic block diagram of a holdover mode device according to another one embodiment of the present disclosure.

Next refer to FIG. 3, and in the embodiment of FIG. 3, the measurement and adjustment module 105 is electrically connected to the digital PLL 104, such that the measurement and adjustment module 105 acquires the time synchronization source 100 by receiving the output clock of the digital PLL 104. When the time synchronization source 100 is not abnormal, the measurement and adjustment module 105 measures the time synchronization source 100 by receiving the output clock of the digital PLL 104 (i.e. indirectly measuring the time synchronization source 100 by measuring the output clock of the digital PLL 104), and when time synchronization source 100 is abnormal, the buffered time synchronization source used by the digital PLL 104 is the buffered signal of the time synchronization source 100. Thus, the holdover mode device further comprises a synchronization source buffer 103c which is electrically connected to the time synchronization source 100 and the multiplexer 102, the synchronization source buffer 103c is configured to buffer the time synchronization source 100, and the time synchronization source 100 buffered in the synchronization source buffer 103c acts as the buffered time synchronization source.

Figure 4:
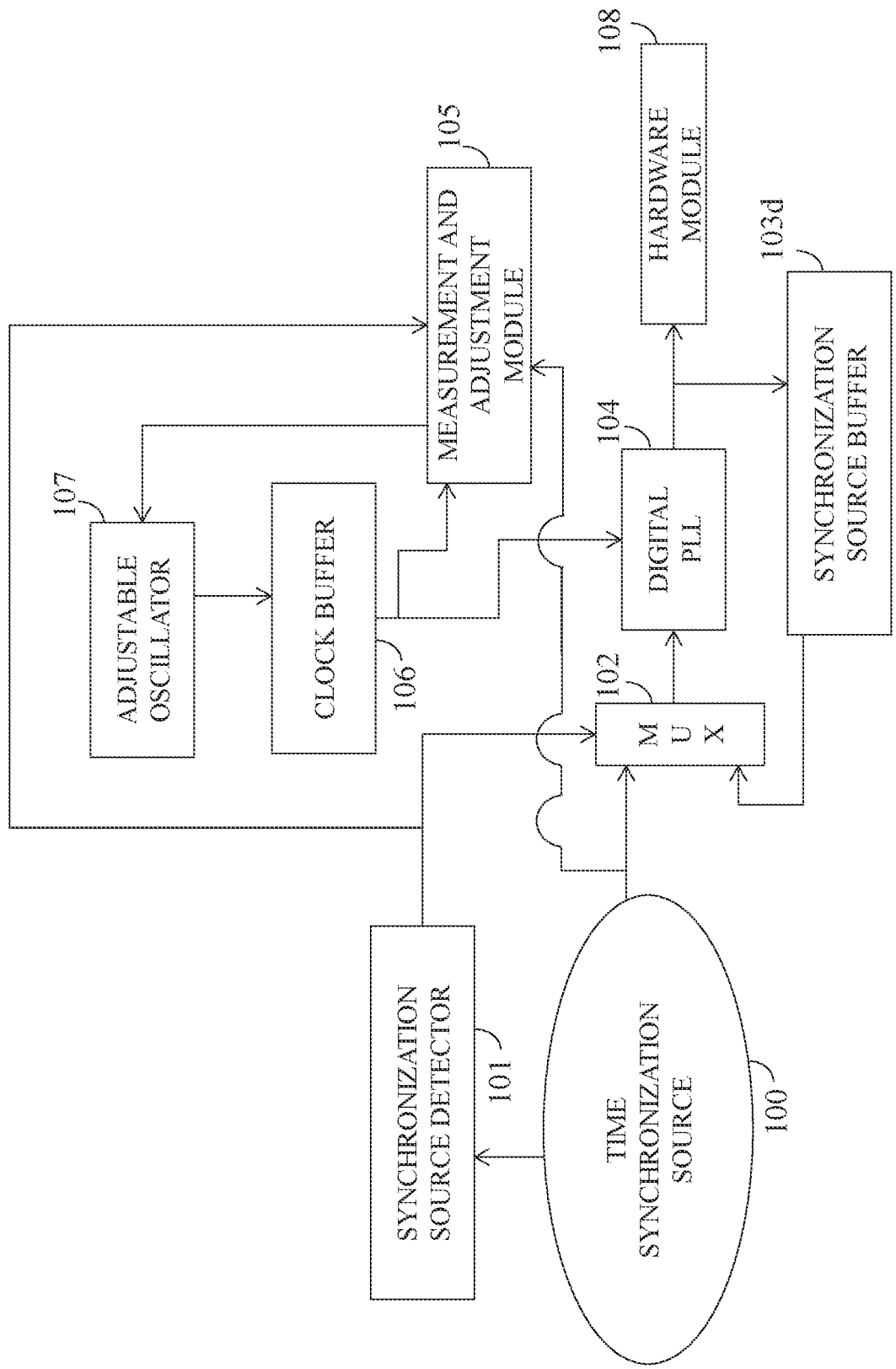
FIG. 4 is a schematic block diagram of a holdover mode device according to another one embodiment of the present disclosure.

Next refer to FIG. 4, and in the embodiment of FIG. 4, the measurement and adjustment module 105 is electrically connected to the time synchronization source 100, so as to directly acquire the time synchronization source 100. When the time synchronization source 100 is not abnormal, the measurement and adjustment module 105 directly measure the time synchronization source 100, and when the time synchronization source 100 is abnormal, the buffered time synchronization source used by the digital PLL 104 is the buffered signal of the output clock of the digital PLL 104. Thus, the holdover mode device can further comprise a synchronization source buffer 103d, wherein the synchronization source buffer 103d is electrically connected to the digital PLL 104 and the multiplexer 102, and configured to buffer the output clock of the digital PLL 104, and the output clock of the digital PLL 104, which is buffered in the synchronization source buffer 103d, acts as the buffered time synchronization source.

By the way, in the embodiments of FIG. 1 to FIG. 4, each of the synchronization source buffers 103a to 103d can integrated with the digital PLL 104, the multiplexer 102 and the synchronization source detector 101 to form a single module chip, and the present disclosure is not limited thereto.

Figure 5:
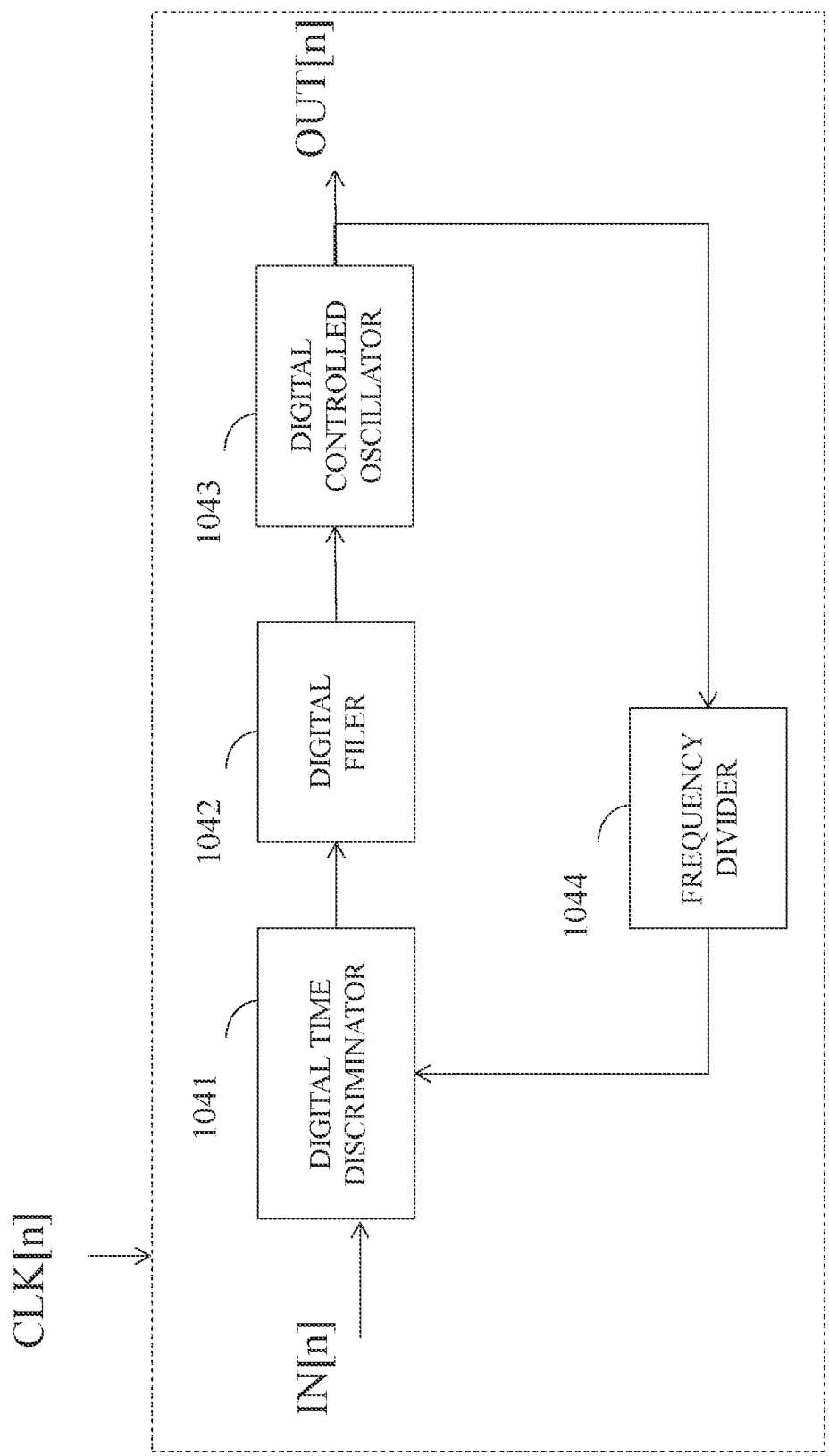
FIG. 5 is a schematic block diagram of a digital PLL of a holdover mode device according to an embodiment of the present disclosure.

Refer to FIG. 5, one implementation of the digital PLL is shown in FIG. 5, and the present disclosure is not limited thereto. In details, the digital PLL receives the reference clock CLK[n], and the reference clock CLK[n] acts as a reference of driving operation of each component of the digital PLL, for example, positive edge triggering or negative edge triggering of the reference clock CLK[n], and the present disclosure is not limited thereto. The digital PLL comprises a digital time discriminator 1041, a digital filter 1042, a digital controlled oscillator 1043 and a frequency divider 1044. The digital time discriminator 1041 is configured to discriminate a time difference between a frequency-divided clock and the input clock IN[n] of the digital PLL to generate a discrimination signal. The digital filter 1042 is electrically connected to the digital time discriminator 1041, and configured to perform a digital filtering process on the discrimination signal to generate an oscillation control signal. The digital controlled oscillator 1043 is electrically connected to the digital filter 1042, and configured to generate the output clock OUT[n] of the digital PLL according to the oscillation control signal. The frequency divider 1044 is electrically connected to the digital controlled oscillator 1043 and the digital time discriminator 1041, and configured to perform a frequency dividing process on the output clock OUT[n] of the digital PLL to generate the frequency-divided clock.

Figure 6:
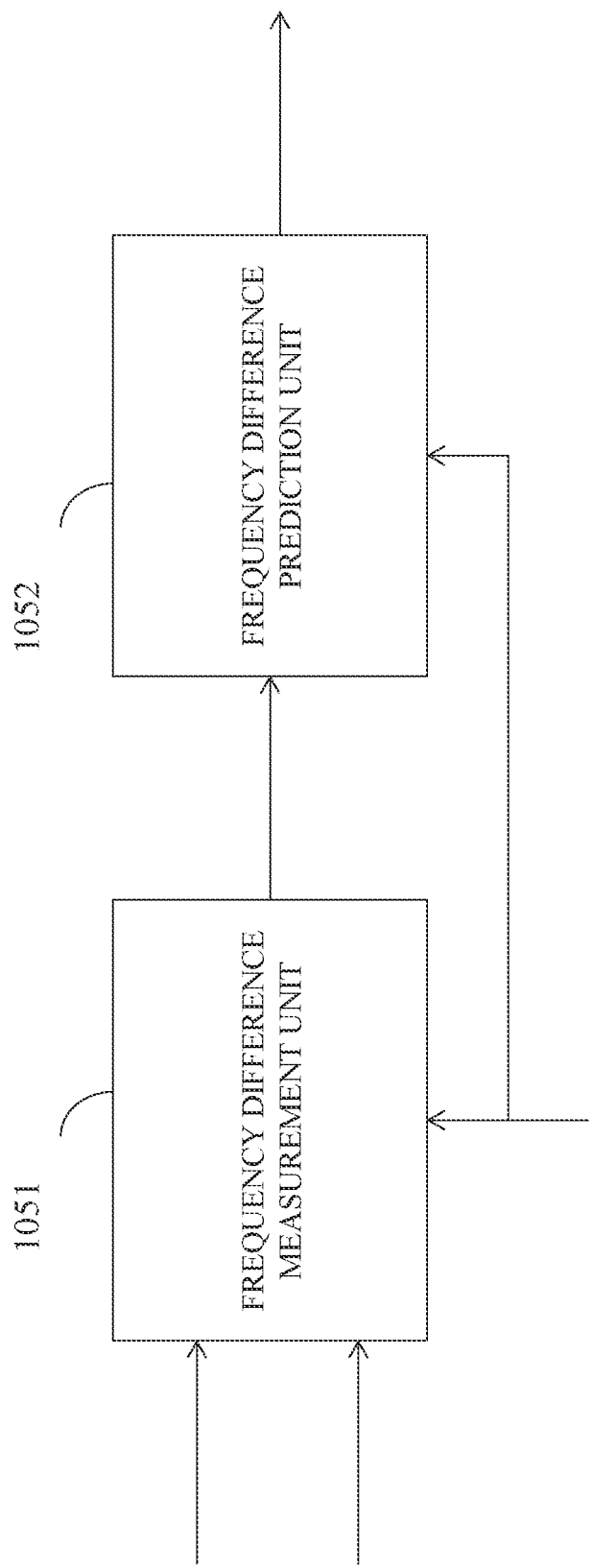
FIG. 6 is a schematic block diagram of a measurement and adjustment module of a holdover mode device according to an embodiment of the present disclosure.

Refer to FIG. 6, one implementation of the measurement and adjustment module is shown in FIG. 5, and the present disclosure is not limited thereto. In details, the measurement and adjustment module comprises a frequency difference measurement unit 1051 and a frequency difference prediction unit 1052. The frequency difference measurement unit 1051 is configured to calculate the variation of the frequency difference between the time synchronization source and the reference clock which is generated by the digital PLL and provided to the adjustable oscillator, when the time synchronization source is not abnormal. The frequency difference prediction unit 1052 is electrically connected to the frequency difference measurement unit 1051. When the time synchronization source is not abnormal, the frequency difference prediction unit 1052 builds the frequency difference prediction model according to the variation of the frequency difference, and buffers multiple frequency difference values of the variation of the frequency difference. When the time synchronization source is abnormal, the frequency difference prediction unit 1052 uses the frequency difference prediction model to calculate the predicted variation of the frequency difference according to the buffered frequency difference values, and generates the adjustment signal according to the predicted variation of the frequency difference.

Figure 7:
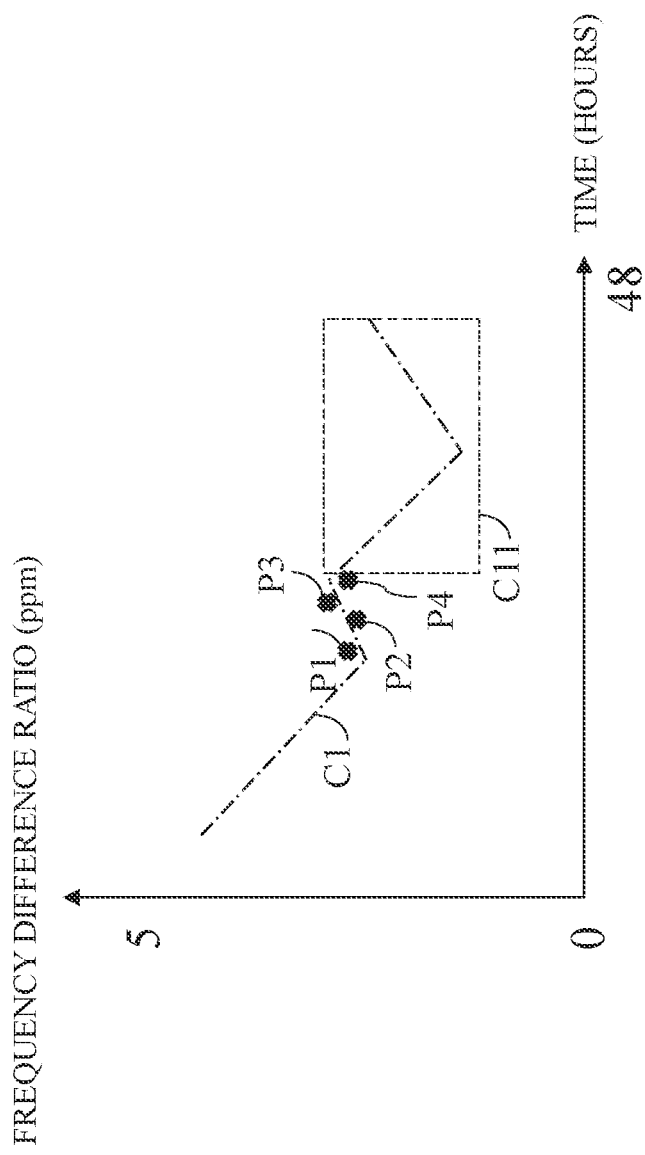
FIG. 7 is a schematic diagram showing a frequency difference prediction model of a holdover mode device according to an embodiment of the present disclosure.

Refer to FIG. 7, and in FIG. 7, the multiple frequency difference values of at least 48 hours before the time synchronization source is abnormal are measured (p.s., to predict the variation of the frequency difference in the next 24 hours after the time synchronization source is abnormal, preferably, the multiple frequency difference values of at least 48 hours before the time synchronization source is abnormal should be measured, the time of 48 hours or 24 hours herein are just for example, and it can be elongated), so as to obtain the variation of the frequency difference. According to the variation of the frequency difference, the frequency difference prediction model C1 (which is presented by a curve, since in the embodiment, it is a linear regression model) can be built. In the embodiment, when the time synchronization source is abnormal, the frequency difference prediction unit uses the frequency difference prediction model to calculate the predicted variation C11 of frequency difference according the buffered frequency difference values P1 to P4 of the previous four time points (p.s., though the example is illustrated with the four buffered frequency difference values P1 to P4, in the present disclosure, at least two buffered frequency difference values are used to predict, and usually, the more the number of the buffered frequency difference values is, the more the prediction accuracy is). Then, the adjustment signal is generated according to the predicted variation C11 of frequency difference, wherein the adjustment signal is configured to adjust the reference clock which is generated by the adjustable oscillator and provided to the digital PLL, so as to prevent the time difference between the drift of the output clock of the digital PLL and the time synchronization source from being too large.

Figure 8:
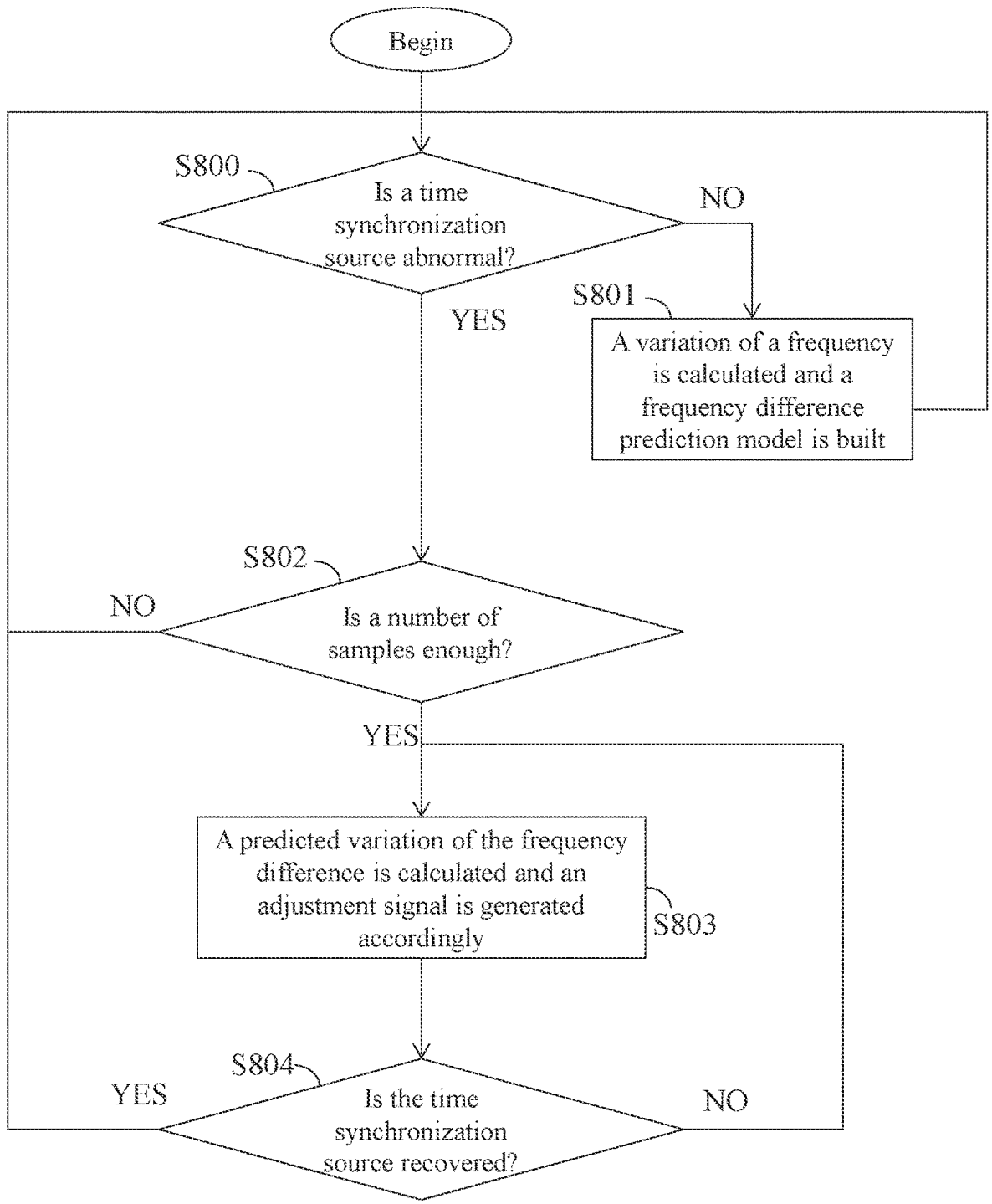
FIG. 8 is a schematic diagram of a holdover mode method according to an embodiment of the present disclosure.

Refer to FIG. 8, the holdover mode method can be executed by the above holdover mode device, and comprise steps as follows. First, at step S800, whether the time synchronization source is abnormal or not is detected. If the time synchronization source is not abnormal, step S801 will be executed, otherwise, step S802 will be executed. At step S801, a variation of a frequency difference between the time synchronization source and a reference clock output by an adjustable oscillator and provided to a digital PLL is calculated, and according to the variation of the frequency difference, a frequency difference prediction model is built. At the same time, since the time synchronization source is not abnormal, the digital PLL receives the time synchronization source, and locks the output clock thereof to be the time synchronization source, so as to provide the time synchronization source to at least a hardware module in a rear end.

At step S802, whether the number of the samples is enough is determined, and that is, whether the measured number of the of the frequency difference values of the variation of the frequency difference achieves a specific number is determined. If the number of the samples is not enough, it means the frequency difference prediction model built is not effective, and thus it returns to step S801 to take more samples to when time synchronization source is not abnormal. If the number of the samples is enough, it means that the frequency difference prediction model built is effective, and step S803 can be executed. When the time synchronization source is abnormal, the digital PLL receives the buffered time synchronization source and locks its output clock to be the buffered time synchronization source, and then provides the buffered time synchronization source to the least one hardware module in the rear end. Thus, the reference clock generated by the adjustable oscillator should be adjusted, so as to prevent the time difference between the drift of the output clock of the digital PLL due to the drift of the reference clock and the time synchronization source from being too large to not meet the requirements of the specification. At step S803, the frequency difference prediction model is used to calculate a predicted variation of the frequency difference according to the multiple buffered frequency difference values, and the adjustment signal is generated according to the predicted variation of the frequency difference for adjusting the reference clock of the adjustable oscillator. Next, at step S804, whether the time synchronization source is recovered is detected. If the time synchronization source is recovered, step S800 will be executed, otherwise step S803 will be executed again.

According to the above explanations, in the present disclosure, when the time synchronization source is abnormal, the time synchronization source and the reference clock output by the adjustable oscillator and provided to the digital PLL are measured, so as to obtain the variation of the frequency difference between the time synchronization source and the reference clock, and then the frequency difference prediction model is built according to the variation of the frequency difference. Next, when the time synchronization source is abnormal, the frequency difference prediction model is used to obtain the predicted variation of the frequency difference according to the multiple buffered frequency difference values. Then, the predicted variation of frequency difference is used to generate the adjustment signal for adjusting the reference clock output by the adjustable oscillator and provided to the digital PLL, such that the time difference between the drift of the output clock of the digital PLL and the time synchronization source due to the abnormality of the time synchronization source can be prevented from being too large. Therefore, the holdover mode device, the holdover method and the measurement and adjustment module can enhance the holdover mode (i.e., enhancing the holdover mode to make the time difference between the drift of the output clock of the digital PLL and the time synchronization source be less than a specific value) when the time synchronization source fails or disappears or the hardware or software associated with the time synchronization source fails.

While the present disclosure has been described by way of example and in terms of exemplary embodiment, it is to be understood that the present disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. A holdover mode device, comprising:
    a digital phase lock loop (PLL), configured to lock an output clock (OUT[n]) thereof to be an input clock (IN[n]) thereof, and to transmit the output clock (OUT[n]) to at least one hardware module;
    a measurement and adjustment module, electrically connected to the digital PLL or a time synchronization source; and
    an adjustable oscillator, electrically connected to the measurement and adjustment module, configured to adjust a reference clock (CLK[n]) generated by the adjustable oscillator according to an adjustment signal;
    wherein when the time synchronization source is not abnormal, the digital PLL is configured to use the time synchronization source as the input clock (IN[n]) thereof, and the measurement and adjustment module is configured to calculate a variation of a frequency difference between the time synchronization source and the reference clock (CLK[n]), and to build a frequency difference prediction model according to the variation of the frequency difference;
    wherein when the time synchronization source is abnormal, the digital PLL is configured to use a buffered time synchronization source as the input clock (IN[n]) thereof, and the measurement and adjustment module is configured to use the frequency difference prediction model to calculate a predicted variation of the frequency difference according to multiple buffered frequency difference values, and to generate the adjustment signal according to the predicted variation of the frequency difference;
    wherein the predicted variation of the frequency difference comprises multiple predicated frequency difference values in at least next 8 to 24 hours, and in a holdover mode, in the at least next 8 to 24 hours, a difference between a drift of the output clock (OUT[n]) and the time synchronization source is within 1500 nanoseconds.

2. The holdover mode device of claim 1, further comprising:
    a synchronization source detector, electrically connected to the measurement and adjustment module and the time synchronization source, configured to detect whether the time synchronization source is abnormal or not to generate a detection result signal;
    a multiplexer, electrically connected to the digital PLL, the synchronization source detector and the time synchronization source, configured to provide the time synchronization source or the buffered time synchronization source as the input clock (IN[n]) of the digital PLL according to the detection result signal; and
    a clock buffer, electrically connected to the adjustable oscillator, the digital PLL and the measurement and adjustment module, configured to buffer the reference clock (CLK[n]), and to provide the reference clock (CLK[n]) to the digital PLL and the measurement and adjustment module.

3. The holdover mode device of claim 2, wherein the measurement and adjustment module is electrically connected to the digital PLL, and configured to acquire the time synchronization source by receiving the output clock (OUT[n]) of the digital PLL, and the holdover mode device further comprises:
    a synchronization source buffer, electrically connected to the digital PLL and the multiplexer, configured to buffer the output clock (OUT[n]) of the digital PLL as the buffered time synchronization source.

4. The holdover mode device of claim 2, wherein the measurement and adjustment module is electrically connected to the time synchronization source, and configured to directly acquire the time synchronization source, and the holdover mode device further comprises:
    a synchronization source buffer, electrically connected to the time synchronization source and the multiplexer, configured to buffer the time synchronization source as the buffered time synchronization source.

5. The holdover mode device of claim 2, wherein the measurement and adjustment module is electrically connected to the digital PLL, and configured to acquire the time synchronization source by receiving the output clock (OUT[n]) of the digital PLL, and the holdover mode device further comprises:
    a synchronization source buffer, electrically connected to the time synchronization source and the multiplexer, configured to buffer the time synchronization source as the buffered time synchronization source.

6. The holdover mode device of claim 2, wherein the measurement and adjustment module is electrically connected to the time synchronization source, and configured to directly acquire the time synchronization source, and the holdover mode device further comprises:
    a synchronization source buffer, electrically connected to the digital PLL and the multiplexer, configured to buffer the output clock (OUT[n]) of the digital PLL as the buffered time synchronization source.

7. The holdover mode device of claim 2, wherein the digital PLL further comprises:

a digital time discriminator, configured to discriminate a time difference between a frequency-divided clock and the input clock (IN[n]) of the digital PLL to generate a discrimination signal;
a digital filter, electrically connected to the digital time discriminator, configured to perform a digital filtering process on the discrimination signal to generate an oscillation control signal;
a digital controlled oscillator, electrically connected to the digital filter, configured to generate the output clock (OUT[n]) of the digital PLL according to the oscillation control signal; and
a frequency divider, electrically connected to the digital controlled oscillator and the digital time discriminator, configured to perform a frequency dividing process on the output clock (OUT[n]) of the digital PLL to generate the frequency-divided clock.

8. The holdover mode device of claim 2, wherein the measurement and adjustment module further comprises:
a frequency difference measurement unit, configured to calculate the variation of the frequency difference between the time synchronization source and the reference clock (CLK[n]) when the time synchronization source is not abnormal; and
a frequency difference prediction unit, electrically connected to the frequency difference measurement unit;
wherein when the time synchronization source is not abnormal, the frequency difference prediction unit builds the frequency difference prediction model according to the variation of the frequency difference, and buffers multiple frequency difference values of the variation of the frequency difference;
wherein when the time synchronization source is abnormal, the frequency difference prediction unit uses the frequency difference prediction model to calculate the predicted variation of the frequency difference according to the buffered frequency difference values, and generates the adjustment signal according to the predicted variation of the frequency difference.

9. The holdover mode device of claim 1, wherein the adjustable oscillator is an oven-controlled crystal oscillator or a digital temperature-controlled oscillator.

10. The holdover mode device of claim 1, wherein abnormality of the time synchronization source comprises a failure of the time synchronization source, a disappearance of the time synchronization source or abnormality of a board card associated with the time synchronization source.

11. The holdover mode device of claim 1, wherein the frequency difference prediction model is a linear regression model, a nonlinear regression model, a neural network model or a support vector machine model.

12. A holdover mode method, comprising:
detecting whether a time synchronization source is abnormal;
when the time synchronization source is not abnormal, using the time synchronization source as an input clock (IN[n]) of a digital PLL to lock an output clock (OUT[n]) of the digital PLL to be the input clock (IN[n]) of the digital PLL, transmitting the output clock (OUT[n]) to at least one hardware module, calculating a variation of a frequency difference between the time synchronization source and a reference clock (CLK[n]) which is generated by an adjustable oscillator and provided to the digital PLL, and building a frequency difference prediction model according to the variation of the frequency difference; and
when the time synchronization source is abnormal, using a buffered time synchronization source as the input clock (IN[n]) of the digital PLL to lock the output clock (OUT[n]) of the digital PLL to be the input clock (IN[n]) of the digital PLL, transmitting the output clock (OUT[n]) to the at least one hardware module, using the frequency difference prediction model to calculate a predicted variation of the frequency difference according to multiple buffered frequency difference values, and adjusting the reference clock (CLK[n]) which is generated by an adjustable oscillator and provided to the digital PLL according to the predicted variation of the frequency difference;
wherein the predicted variation of the frequency difference comprises multiple predicated frequency difference values in at least next 8 to 24 hours, and in a holdover mode, in the at least next 8 to 24 hours, a difference between a drift of the output clock (OUT[n]) and the time synchronization source is within 1500 nanoseconds.

13. A measurement and adjustment module, used in a holdover mode device, comprising:
a frequency difference measurement unit, configured to calculate a variation of a frequency difference between a time synchronization source and a reference clock (CLK[n]) which is generated by an adjustable oscillator and provided to a digital PLL when the time synchronization source is abnormal; and
a frequency difference prediction unit, electrically connected to the frequency difference measurement unit;
wherein when the time synchronization source is not abnormal, the frequency difference prediction unit builds a frequency difference prediction model according to the variation of the frequency difference, and buffers multiple frequency difference values of the variation of the frequency difference;
wherein when the time synchronization source is abnormal, the frequency difference prediction unit uses the frequency difference prediction model to calculate a predicted variation of the frequency difference according to the buffered frequency difference values, and generates the adjustment signal according to the predicted variation of the frequency difference;
wherein the predicted variation of the frequency difference comprises multiple predicated frequency difference values in at least next 8 to 24 hours, and in a holdover mode, in the at least next 8 to 24 hours, a difference between a drift of the output clock (OUT[n]) and the time synchronization source is within 1500 nanosecond.

* * * * *